Nov. 13, 1962 T. C. G. WAGNER 3,064,205

VARIABLE FREQUENCY OSCILLATOR

Filed Sept. 29, 1958

INVENTOR.
THOMAS C. G. WAGNER

BY Arthur H. Swanson

ATTORNEY.

United States Patent Office 3,064,205

Patented Nov. 13, 1962

3,064,205

VARIABLE FREQUENCY OSCILLATOR

Thomas C. G. Wagner, Rockville, Md., assignor to Minneapolis-Honeywell Regulator Company, Minneapolis, Minn., a corporation of Delaware Filed Sept. 29, 1958, Ser. No. 764,115

6 Claims. (Cl. 331—109)

This invention relates to electrical apparatus. More specifically, the present invention relates to electrical oscillators.

An object of the present invention is to provide an improved variable frequency electrical oscillator.

Another object of the present invention is to provide an improved variable frequency electrical oscillator controlled by a unidirectional input signal.

Still another object of the present invention is to provide an improved variable frequency electrical oscillator controlled by an alternating input signal.

Variable frequency oscillators are frequently employed in the transmission of information signals. This system of communication is commonly entitled frequency-modulation. In this system, the information signals produce frequency deviations of a transmitted signal about a center, or carrier, frequency. The amplitude of the information signal determines the degree of frequency deviation, and the polarity of the information signal determines the direction of frequency deviation with relation to the carrier frequency. Consequently, a unidirectional information signal would produce a frequency deviation on one side of the carrier frequency. Conversely, alternating information signals would produce a frequency deviation alternating on opposite sides of the carrier frequency. In order to obtain a correct representation of the information signal, the variable frequency oscillator must respond linearly to the information signal.

The variable frequency oscillator should also be characterized by a relatively high sensitivity to the information signals and by a temperature-stabilized mode of operation to minimize spurious frequency deviations.

Accordingly, it is a further object of the present invention to provide an improved variable frequency oscillator having a linear responsive characteristic to information input signals.

A still further object of the present invention is to provide an improved variable frequency oscillator having a relatively high sensitivity to information input signals and a temperature-compensated operating characteristic.

Yet another object of the present invention is to provide an improved variable frequency oscillator, as set forth, which is characterized by simplicity of operation and construction.

In accomplishing these and other objects, there has been provided, in accordance with the present invention, a variable frequency oscillator utilizing an alternating current amplifier with a capacitive feedback loop. An output signal of the amplifier is alternately limited between two present voltage limits by a double-diode limiter. The limited output signal is coupled by the feedback loop to an input circuit of the amplifier. The input circuit comprises a novel combination of diodes and capacitors which is responsive to an information input signal to produce a control signal for the amplifier. This control signal, representing a modulation of the feedback signal by the input information, is amplified by the amplifier to control the operation of the feedback loop. The resulting variation in the operation of the feedback loop produces a variation in the limiting action of the diode limiter to effect a variation in the frequency of the limited output signal.

A better understanding of the present invention may be had from the following detailed description when read in connection with the accompanying drawing, in which.

Figure 1:
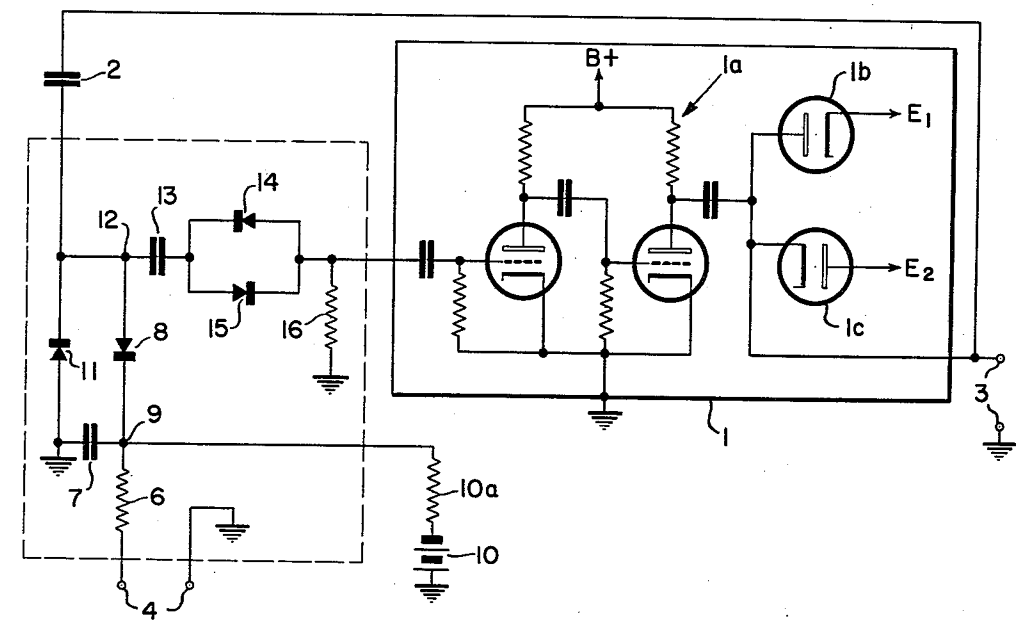
FIG. 1 is a schematic diagram of a variable frequency electrical oscillator embodying the present invention.

Referring to FIG. 1 in more detail, there is shown a variable frequency electrical oscillator which includes an alternating current amplifier-limiter 1 with a feedback capacitor 2. The amplifier-limiter is a device well-known in the art and may be an arrangement such as that shown in FIG. 1. The circuit shown therein comprises a signal amplifier 1*a* with a pair of signal-limiting diodes 1*b* and 1*c* connected to an output of the amplifier. The limiting diodes 1*b* and 1*c* are connected to bias voltage $E_1$ and $E_2$ to determine the effective upper and lower limits of the output signal. Briefly, the limiting diodes 1*b* and 1*c* are connected to the source of output signals in an oppositely phased relationship. In other words, the anode of one of the diodes 1*b* and the cathode of the other diode 1*c* are connected to the signal source. The other ends of the diodes 1*b* and 1*c* are connected to corresponding bias voltages $E_1$ and $E_2$. The diodes 1*b* and 1*c* present a high impedance to the output signals from the signal source 1*a* if the amplitude of the output signals has a value between the bias voltages. A variation of the output signal amplitude past either bias voltage produces a current conduction through the diodes in a low impedance, or short-circuit, direction. Consequently, the diodes 1*b* and 1*c* prevent the output signal from maintaining an amplitude greater than the bias voltages. This restriction of the output signal is commonly referred to as "clipping." The resulting output signal is a reproduction of the signal variation of the signal source except during the time of an occurrence of a signal amplitude greater than the bias voltages. During this time, the output signal amplitude is fixed at the level of the corresponding bias voltage. A pair of output terminals 3 are provided for connecting a source of information input signals to the oscillator of the present invention. The input terminals 4 are connected to a modulating circuit 5 which produces a control signal for the amplifier-limiter 1. This control signal represents a combination of the information signals and a feedback signal from the feedback capacitor 2. One of the input terminals 4 is connected to ground, and the other terminal is connected to an input resistor 6. The input resistor 6, in turn, is connected to one electrode of a bypass capacitor 7 and the cathode of a first input diode 8 at a junction 9. A unidirectional current source represented by a battery 10 and a resistor 10*a* is also connected to the junction 9. The other electrode of the bypass capacitor 7 is connected to a common ground with the anode of the second input diode 11. The anode of the first input diode 8 and the cathode of second input diode 11 are connected to a common junction 12 with the feedback capacitor 2. A coupling capacitor 13 couples this common junction 12 with a pair of blocking diodes 14, 15. Specifically, the coupling capacitor 13 is connected to the anode of one blocking diode 15 and to the cathode of the other blocking diode 14. The cathode and anode corresponding to the other sides at the blocking diodes 14 and 15 are connected to an input resistor 16 of the amplifier-limiter 1. The diodes 8, 11, 14, and 15 may be crystal diodes or tube-type diodes, such devices being well-known in the art.

The operation of the oscillator of the present invention may be explained with reference to an operating mode during an absence of an imput information signal. Assuming the feedback capacitor 2 is initially uncharged, the modulator circuit 5 is inoperative to produce a control signal for the amplifier-limiter 1. The bypass capacitor 7 and the input diodes 8 and 11 comprise a current path between the feedback capacitor 2 and the unidirectional current source 10. The unidirectoinal current is continuously supplied by the current source 10 to the bypass capacitor 7, to charge the bypass capacitor 7 to a reference level voltage for the operation of the feedback capacitor 2. Initially, the feedback capacitor 2 starts charging toward the supply voltage of the amplifier-limiter 1. The charging current, drawn through one of the input diodes, say, for example, diode 8 is the concluding diode, from the bypass capacitor 7, produces a voltage signal across that diode. This voltage signal is coupled by the coupling capacitor 13 to the pair of blocking diodes 14 and 15. The blocking diodes 14 and 15, in turn, couple the voltage signal to the input resistor 16 of the amplifier-limiter 1. However, the voltage signal suffers a voltage drop across the blocking diodes 14 and 15, which voltage drop subtracts from the voltage signal. The blocking diodes 14 and 15 are arranged to produce a voltage drop which is nearly equal to the voltage signal. Consequently, the control signal to the amplifier-limiter 1 representing the difference between the voltage signal and the blocking diode voltage drop is a very low amplitude signal. The amplifier-limiter 1 is arranged to have a very high gain in the amplifier section 1*a*. Thus, the initial small control signal is amplified to a preset limit of the limiter section of the amplifier-limiter 1. The feedback capacitor 2 continues charging, due to the continuing reference level voltage on the bypass capacitor 7, toward the limited output signal of the amplifier-limiter 1. Since the voltage across the feedback capacitor 2 ultimately approaches the value of the limited output signal, the capacitor charging current through the conducting input diode 8 correspondingly decreases. This decrease of the charging current is applied to the amplifier-limiter 1 as a decrease in the control signal. The decrease of the control signal, because of the high gain of the amplifier-limiter 1, reduces the output signal to the other present limit of the limiter section. The feedback capacitor 2 immediately begins discharging toward the limited value of the new output signal. The reversal of the capacitive current of the feedback capacitor 2 initiates conduction in the other input diode 11 and recharges the bypass capacitor 7. The voltage signal from this conducting input diode 11 is applied to the amplifier-limiter 1 in a manner similar to that described above in relation to the initial charging of the feedback capacitor 2. However, the polarity of the control signal is determined by the direction of the charging current for the feedback capacitor 2 through the conducting input diode. Consequently, the polarity of the control signal applied to the amplifier-limiter 1 and corresponding to the discharging of the feedback capacitor 2 is reversed with respect to that corresponding to the charging thereof. Thus, when the voltage of the discharging feedback capacitor 2 approaches the new present limit of the output signal, the decrease in discharging capacitive current through the conducting input diode 11 decreases the control voltage of corresponding polarity. This decrease in the control voltage is a variation of the control voltage in the same direction as the initial capacitor charging control signal. Since the amplifier-limiter 1 responds only to variations in the control signal; i.e., the amplifier-limiter 1 has no gain for a steady control signal, this input signal variation is amplified to the preset limit corresponding to the initial feedback capacitor charging control signal. The feedback capacitor 2 immediately reverses its operation and begins recharging toward the limited value of the output signal. Further operation of the oscillator of the present invention with an absence of an information input signal is performed in a manner similar to that described above. Thus, it may be seen, that in the absence of an information input signal, this oscillator produces an oscillatory output signal which is a series of rectangular wave pulses of a constant frequency, which frequency is determined by the magnitude of the applied reference level voltage from the source 10.

The application of an information input signal to the input terminals 4 effectively alters the magnitude of the reference level voltage applied to the feedback capacitor 2. This allows the feedback capacitor 2 to be charged or discharged in a greater or smaller time depending on the polarity of the applied information input signal relative to the reference level voltage. The information input signal may be a unidirectional signal or an alternating signal. The operation of the oscillator with a unidirectional input signal will be considered first. The information input signal is applied through the input terminals 4 and the input resistor 6 to the common junction 9. The input signal, consequently, is superimposed upon the unidirectional reference level signal supplied by the source 10. The input signal may be applied to oppose or to aid the unidirectional reference level signal. The resulting reference level signal supplied to the feedback capacitor 2 is the algebraic sum of the input signal and the unidirectional signal. In other words, the resultant level is either the difference of the two sources if their polarities are opposing or the sum of the two sources if their polarities are aiding. The operation of the oscillator of the present invention with an input signal, applied as described above, is performed in a similar manner to that described previously with relation to an absence of an input information signal. However, the time required for charging the discharging of the feedback capacitor 2 is dependent on two additional factors; namely, the amplitude and the polarity of the input signal with respect to the unidirectional reference level signal. It may be seen that the operation of the feedback capacitor 2 produces an output signal varying in magnitude between two preset limits at a predetermined frequency. Thus, a combined reference level signal which causes the feedback capacitor 2 to charge and to discharge at a faster rate causes the system to produce a higher frequency output signal than a combined reference level signal that hinders the charging and discharging of the feedback capacitor 2. A center frequency output signal is produced by the reference level signal obtained with an absence of the input signal. This frequency of the output signal is hereinafter referred to as the carrier frequency. Referring to the previously described no-input-signal cycle of operation, the voltage on the feedback capacitor 2 approaches the limited value of the output signal over a period of time that is dependent on the value of the reference signal. Consequently, the frequency characteristic of the output signal may be summarized as follows:

The presence of an input information signal having a polarity which results in a reference level signal represented by the sum of the two unidirectional signal sources produces a frequency deviation above the carrier frequency. It may be seen that this frequency deviation is linearly proportional to the amplitude of the input signal.

The presence of an input information signal having a polarity which results in a reference level signal represented by the difference between the two unidirectional signal sources produces a frequency deviation below the carrier frequency. This frequency deviation is also linearly proportional to the amplitude of the input signal.

The operation of the oscillator with an alternating input information signal may be considered as a combination of two unidirectional information input signal operations. Referring to the unidirectional information input signal operation described above, the alternating input signal is composed of continuously varying alternate-polarity unidirectional signals. Assuming the polarity of the first half-cycle of the alternating input signal is such as to aid the reference level signal from the source 10, the combined reference signal increases from a no-input-signal level to a peak value representing the peak amplitude of the alternating signal. The subsequent decrease of the alternating signal to a zero level produces a corresponding decrease in the reference level to a no-input-signal value representing the zero level of the alternating input signal. The frequency of the output signal, correspondingly, increases from the carrier frequency to a maximum positive deviation value and returns to the carrier frequency.

The polarity of the second half-cycle of the alternating input signal, necessarily, is such as to oppose the source 10. The resulting reference signal decreases from the no-input-signal level to a low value representing the peak amplitude of the second half-cycle of the alternating input signal. The subsequent decrease of the alternating input signal to a zero level produces a corresponding increase in the reference signal to the no-input-signal value. The frequency of the output signal, correspondingly, decreases from the carrier frequency to a maximum negative deviation value and returns to the carrier frequency. Further operation of the oscillator with an alternating input signal comprises a repetition of the frequency deviation just described. Thus, for a continuously alternating input signal, an output signal is produced by the oscillator of the present invention having a frequency deviation alternately on opposite sides of the carrier frequency. The extent of the frequency deviation is linearly proportional to the amplitude of the alternating input signal.

Figure 2:
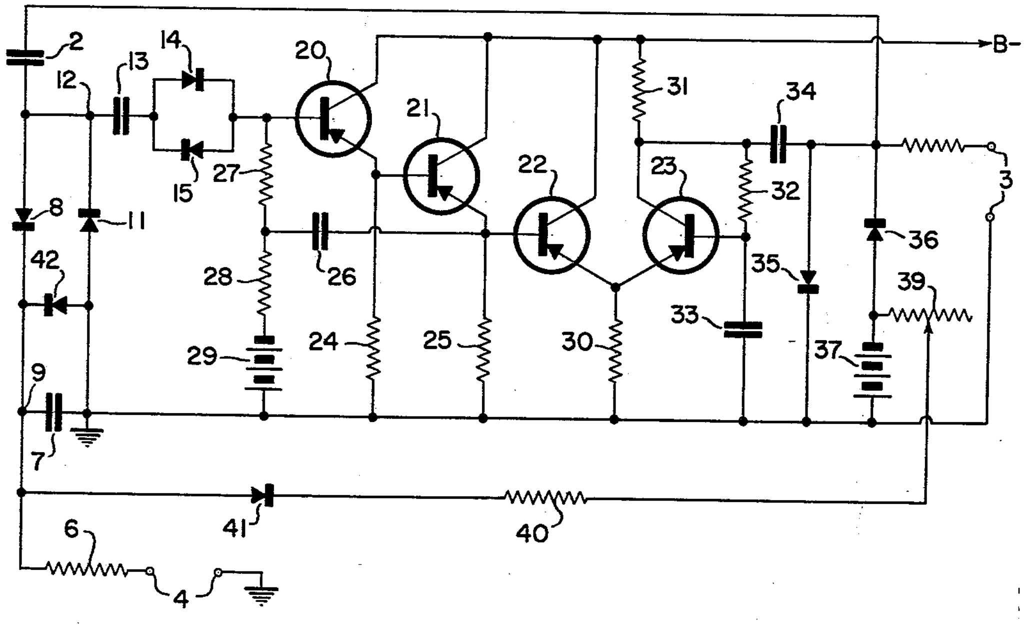
FIG. 2 is a schematic diagram of a variable frequency electrical oscillator embodying the present invention and featuring a specific transistor amplifier.

FIG. 2 is a schematic diagram showing a transistorized version of the amplifier-limiter 1 for the oscillator of the present invention. The oscillator shown in FIG. 2 operates in a manner as described above with relation to the oscillator shown in FIG. 1.

A plurality of transistors 20, 21, 22, 23 comprise the amplifying section of the amplifier-limiter. The first two transistors 20 and 21 are connected as emitter followers with load resistors 24 and 25, respectively. A feedback capacitor 26 provides regenerative feedback for the two emitter followers. A pair of input resistors 27 and 28, in combination with a bias supply battery 29, comprise the input circuit of the amplifier-limiter. The second two transistors 22 and 23 are connected to an emitter-coupled, non-phase-inverting output stage with a common emitter resistor 30. An output stage load resistor 31 is connected to the collector of the last transistor 23. Bias voltage for the last transistor 23 is obtained from a bias resistor 32 and a by-pass capacitor 33. An output signal coupling capacitor 34 couples the amplifier section to the limiter section of the amplifier limiter 1. The limiter section comprises a pair of diodes 35 and 36 and a bias supply battery 37. The bias battery 37 is also used to supply a unidirectional current as a reference level signal to the common junction 9. The value of this current is determined by a serial combination of a variable resistor 39 and a fixed resistor 40. Consequently, the variable resistor 39 and the fixed resistor 40 are used to adjust the carrier frequency of the oscillator of the present invention.

It has been found that transistor amplifiers are usually temperature sensitive; i.e., the gain of the amplifier is inversely proportional to the ambient temperature of the transistor environment. Therefore, a temperature-compensating diode 41 is included in the second supply line 40. The compensating diode 41 also exhibits temperature sensitive properties. Specifically, the resistance of the diode 41 is inversely proportional to temperature. The compensating diode 41, consequently, adjusts the value of the portion of the unidirectional current supplied along the second supply line 40. The current adjustment performed by the compensating diode 41 is in such a direction as to neutralize the effect of temperature on the amplifier gain. Briefly, the compensating diode 41 provides a higher reference level signal for the feedback capacitor 2 in response to an increase in ambient temperature. The increase in temperature also results in a decrease in the gain of the amplifier with a consequent increase in the value of the control signal suitable for effecting limiting action of the amplifier-limiter. Consequently, the limiting action is terminated with a smaller decrease in the control signal. The resulting overall effect of the decrease in gain of the amplifier section is to shorten the charging and the discharging time of the feedback capacitor 2. Thus, a decrease in gain increases the frequency of the output signal. However, the higher reference level signal provided by the compensating diode 41 increases the control signal to the amplifier-limiter 1 to neutralize the effect of the loss in gain. A decrease in the ambient temperature is similarly neutralized by the compensating diode 41. Specifically, the decrease in temperature results in an increase in the amplifier gain. This effect is offset by a decrease in the reference level signal produced by a decrease in the unidirectional current controlled by the compensating diode 41.

In order to obviate a heavy conduction by both input diodes 8 and 11 before the feedback capacitor 2 has started its operation, a starting diode 42 is connected across the bypass capacitor 7. The starting diode 42 is arranged to have a lower forward resistance than the combined forward resistances of the input diodes 8 and 10. Consequently, conduction in the input diode circuit always initiates in the starting diode 42. The further operation of the charging of the feedback capacitor 2 transfers the conduction to the appropriate input diode.

Thus, it may be seen that there has been provided, in accordance with the present invention, a variable frequency electrical oscillator, which is characterized by the ability to respond linearly to a unidirectional input signal or to an alternating input signal and to provide a relatively high sensitivity to the input signals with a temperature-compensated operating characteristic.

What is claimed is:

1. A variable frequency electrical oscillator comprising a signal amplifier having a plurality of transistor stages and including at least one emitter-coupled single transistor stage and one non-phase-inverting two transistor stage having a common emitter resistor, said amplifier also having an input circuit and an output circuit, said output circuit including a diode limiter for limiting an output signal from said amplifier, a signal feedback circuit connected between said input circuit and said diode limiter to produce an oscillatory operation of said amplifier, said feedback circuit including a feedback capacitor, and a control means for controlling the charging and the discharging of said feedback capacitor thereby to affect the frequency of oscillation of said amplifier, said control means being responsive to an input signal to affect said charging and discharging of said capacitor.

2. A variable frequency electrical oscillator comprising a single amplifier having a plurality of transistor stages and including at least one emitter-coupled single transistor stage and one non-phase-inverting two transistor stage with a common emitter resistor, said amplifier also having an input circuit and an output circuit, said output circuit including a diode limiter having a pair of oppositely connected diodes for limiting the maximum and minimum amplitudes of an output signal from said signal amplifier, a signal feedback circuit connected between said input circuit and said diode limiter to produce an oscillatory operation of said amplifier, said feedback circuit including a feedback capacitor, and a control means for controlling the charging and the discharging of said feedback capacitor thereby to affect the frequency of oscillation of said amplifier, said control means being responsive to an input signal to affect said charging and discharging of said capacitor.

3. A variable frequency electrical oscillator comprising a signal amplifier having an input circuit and an output circuit, said output circuit including a diode limiter for limiting an output signal from said amplifier, a signal feedback circuit connected between said input circuit and said diode limiter to produce an oscillatory operation of said amplifier, said feedback circuit including a feedback capacitor, and a control means for controlling the charging and the discharging of said feedback capacitor thereby to affect the frequency of oscillation of said amplifier, said control means including a reference supply for supplying a reference level signal to said feedback capacitor to determine a center frequency of oscillation of said amplifier, said reference supply including a pair of oppositely connected diodes and a bypass capacitor with an anode of one of said diodes and one electrode of said bypass capacitor being connected to ground and a cathode of a second of said diodes and the other electrode of said bypass capacitor having a common connection with a unidirectional current supply, and the remaining cathode and anode of said diodes being connected to said input circuit of said amplifier, said control means being responsive to an input signal to affect said charging and discharging of said feedback capacitor.

4. A variable frequency electrical oscillator comprising a signal amplifier having an input circuit and an output circuit, said input circuit including a pair of oppositely connected diodes arranged in parallel with each other and in series with a control signal applied to said input circuit, said output circuit including a diode limiter having a pair of oppositely connected diodes for limiting the maximum and minimum amplitudes of an output signal from said signal amplifier, a signal feedback circuit connected between said input circuit and said diode limiter to produce an oscillatory operation of said amplifier, said feedback circuit including a feedback capacitor, and a control means for controlling the charging and the discharging of said feedback capacitor thereby to affect the frequency of oscillation of said amplifier, said control means being responsive to an input signal to affect said charging and discharging of said capacitor.

5. A variable frequency electrical oscillator comprising a signal amplifier having an input circuit and an output circuit, said output circuit including a diode limiter for limiting an output signal from said amplifier, a signal feedback circuit connected between said input circuit and said diode limiter to produce an oscillatory operation of said amplifier, said feedback circuit including a feedback capacitor, and a control means for controlling the charging and the discharging of said feedback capacitor thereby to affect the frequency of oscillation of said amplifier, said control means including a reference supply for supplying a reference level signal to said feedback capacitor to determine a center frequency of oscillation of said amplifier, said reference supply including a pair of oppositely connected diodes and a bypass capacitor with an anode of one of said diodes and one electrode of said bypass capacitor being connected to ground and a cathode of a second of said diodes and the other electrode of said bypass capacitor having a common connection with a unidirectional current supply, and the remaining cathode and anode of said diodes being connected to said input circuit of said amplifier, said control means also including a pair of input terminals for applying an input signal to said common connection to affect said charging and discharging of said feedback capacitor.

6. A variable frequency electrical oscillator comprising a signal amplifier having an input circuit and an output circuit, said input circuit including a pair of oppositely connected diodes arranged in parallel with each other and in series with a control signal applied to said input circuit, said output circuit including a diode limiter having a pair of oppositely connected diodes for limiting the maximum and minimum amplitudes of an output signal from said signal amplifier, a signal feedback circuit connected between said input circuit and said diode limiter to produce an oscillatory operation of said amplifier, said feedback circuit including a feedback capacitor, and a control means for controlling the charging and the discharging of said feedback capacitor thereby to affect the frequency of oscillation of said amplifier, said control means including a reference supply for supplying a reference level signal to said feedback capacitor to determine a center frequency of oscillation of said amplifier, said supply including a pair of oppositely connected input diodes and a bypass capacitor with an anode of one of said input diodes and one electrode of said bypass capacitor being connected to ground, and a cathode of a second of said input diodes and the other electrode of said bypass capacitor having a common connection with a unidirectional current supply, and the remaining cathode and anode of said input diodes being connected to said input circuit of said amplifier, said control means also including a pair of input terminals for applying an input signal to said common connection to affect said charging and discharging of said feedback capacitor.

References Cited in the file of this patent

UNITED STATES PATENTS

| | | |
|---|---|---|
| 2,207,511 | Geiger | July 9, 1940 |
| 2,568,914 | Faudell | Sept. 25, 1951 |
| 2,682,035 | Schwittek | June 22, 1954 |
| 2,848,610 | Freienmuth | Aug. 19, 1958 |